(12) United States Patent
Weiner et al.

(10) Patent No.: US 10,133,493 B2
(45) Date of Patent: Nov. 20, 2018

(54) DRAM CONTROLLER WITH ADAPTIVE PRECHARGE POLICY

(71) Applicant: Marvell World Trade Ltd., St. Michael (BB)

(72) Inventors: Michael Weiner, Nes Ziona (IL); Hunglin Hsu, Cupertino, CA (US); Nadav Klein, Tel Aviv (IL); Junhua Xu, San Jose, CA (US); Chia-Hung Chien, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/444,342

(22) Filed: Feb. 28, 2017

(65) Prior Publication Data

US 2017/0255395 A1 Sep. 7, 2017

Related U.S. Application Data

(60) Provisional application No. 62/301,908, filed on Mar. 1, 2016.

(51) Int. Cl.
*G06F 12/08* (2016.01)
*G06F 3/06* (2006.01)
*G11C 11/4094* (2006.01)

(52) U.S. Cl.
CPC .......... *G06F 3/0611* (2013.01); *G06F 3/068* (2013.01); *G06F 3/0659* (2013.01); *G11C 11/4094* (2013.01)

(58) Field of Classification Search
CPC .......... G06F 12/00; G06F 12/08; G06F 13/00; G06F 3/06

USPC ................................ 711/100, 105, 154, 200
See application file for complete search history.

(56) References Cited

U.S. PATENT DOCUMENTS

| | | | | |
|---|---|---|---|---|
| 5,631,871 | A * | 5/1997 | Park | G11C 11/4076 365/203 |
| 5,813,038 | A * | 9/1998 | Thome | G06F 13/1631 365/238.5 |
| 6,052,134 | A * | 4/2000 | Foster | G06F 12/0215 345/533 |
| 6,279,116 | B1 * | 8/2001 | Lee | G11C 7/1018 711/167 |
| 2016/0266792 | A1 * | 9/2016 | Amaki | G06F 12/0246 |

OTHER PUBLICATIONS

JEDEC Standard, "DDR4 SDRAM", JESD79-4A, 218 pages, Nov. 2013.

* cited by examiner

*Primary Examiner* — Tuan Thai

(57) ABSTRACT

A Dynamic Random Access Memory (DRAM) controller includes a memory interface and a processor. The memory interface is configured to communicate with a DRAM including one or more memory banks. The processor is configured to receive Input/Output (I/O) commands, each I/O command addressing a respective memory bank and a respective row within the memory bank to be accessed in the DRAM, to further receive one or more indications, indicative of likelihoods that a subsequent I/O command will address a same row in a same memory bank as a previous I/O command, to adaptively set, based on the indications, a policy of deactivating rows of the DRAM, and to execute the I/O commands in the DRAM in accordance with the policy.

17 Claims, 2 Drawing Sheets

DRAM CONTROLLER WITH ADAPTIVE PRECHARGE POLICY

CROSS-REFERENCE TO RELATED APPLICATIONS

This application claims the benefit of U.S. Provisional Patent Application 62/301,908, filed Mar. 1, 2016, whose disclosure is incorporated herein by reference.

FIELD OF THE DISCLOSURE

The present disclosure relates generally to memory systems, and particularly to methods and systems for controlling Dynamic Random Access Memory (DRAM).

BACKGROUND

Dynamic Random Access Memory (DRAM) devices are used in a wide variety of electronic systems and applications. One popular family of DRAM devices is Double Data Rate Synchronous Dynamic Random Access Memory (DDR SDRAM), often referred to simply as DDR. Several types and generations of DDR devices have been developed, for example $3^{rd}$-generation DDR (DDR3), $4^{th}$-generation DDR (DDR4) and/or Low-Power DDR4 (LPDDR4). DDR4, for example, is specified in JEDEC Standard JESD79-4A, entitled "DDR4 SDRAM," November, 2013, which is incorporated herein by reference.

The description above is presented as a general overview of related art in this field and should not be construed as an admission that any of the information it contains constitutes prior art against the present patent application.

SUMMARY

An embodiment that is described herein provides a Dynamic Random Access Memory (DRAM) controller including a memory interface and a processor. The memory interface is configured to communicate with a DRAM including one or more memory banks. The processor is configured to receive Input/Output (I/O) commands, each I/O command addressing a respective memory bank and a respective row within the memory bank to be accessed in the DRAM, to further receive one or more indications, indicative of likelihoods that a subsequent I/O command will address a same row in a same memory bank as a previous I/O command, to adaptively set, based on the indications, a policy of deactivating rows of the DRAM, and to execute the I/O commands in the DRAM in accordance with the policy.

In some embodiments, the processor is configured to adaptively set the policy by choosing between a first type of the I/O command that automatically deactivates the row following execution, and a second type of the I/O command that retains the row active following the execution. In an example embodiment, the first type of the I/O command performs automatic row deactivation, and the second type of the I/O command does not perform automatic row deactivation.

In some embodiments, the processor is configured to adaptively set the policy by increasing a rate of deactivating the rows in response to a decrease in the likelihoods, and decreasing the rate of deactivating the rows in response to an increase in the likelihoods. In an embodiment, the processor is configured to adaptively set the policy by increasing a rate of deactivating the rows when the indications indicate that the I/O commands have a random access pattern, and decreasing the rate of deactivating the rows when the indications indicate that the I/O commands have a sequential access pattern. In another embodiment, the processor is configured to adaptively set the policy by increasing a rate of deactivating the rows when the indications indicate that the I/O commands have a bandwidth lower than a bandwidth threshold, and decreasing the rate of deactivating the rows when the indications indicate that the I/O commands have a bandwidth higher than the bandwidth threshold.

In some embodiments, the processor is configured to adaptively set the policy by setting, based on the indications, a time duration from execution of an I/O command in a row until deactivation of the row.

There is additionally provided, in accordance with an embodiment that is described herein, a method for controlling a Dynamic Random Access Memory (DRAM) including one or more memory banks. The method includes receiving Input/Output (I/O) commands, each I/O command addressing a respective memory bank and a respective row within the memory bank to be accessed in the DRAM, and further receiving one or more indications, indicative of likelihoods that a subsequent I/O command will address a same row in a same memory bank as a previous I/O command. A policy of deactivating rows of the DRAM is adaptively set based on the indications. The I/O commands are executed in the DRAM in accordance with the policy.

There is further provided, in accordance with an embodiment that is described herein, a system including a Dynamic Random Access Memory (DRAM), one or more clients and a DRAM controller. The DRAM includes one or more memory banks. The one or more clients are configured to issue Input/Output (I/O) commands, each I/O command addressing a respective memory bank and a respective row within the memory bank to be accessed in the DRAM, and to provide one or more indications, indicative of likelihoods that a subsequent I/O command will address a same row in a same memory bank as a previous I/O command. The DRAM controller is configured to receive the I/O commands and the indications from the one or more clients, to adaptively set, based on the indications, a policy of deactivating rows of the DRAM, and to execute the I/O commands in the DRAM in accordance with the policy.

The present disclosure will be more fully understood from the following detailed description of the embodiments thereof, taken together with the drawings in which:

DETAILED DESCRIPTION OF EMBODIMENTS

Figure 1:
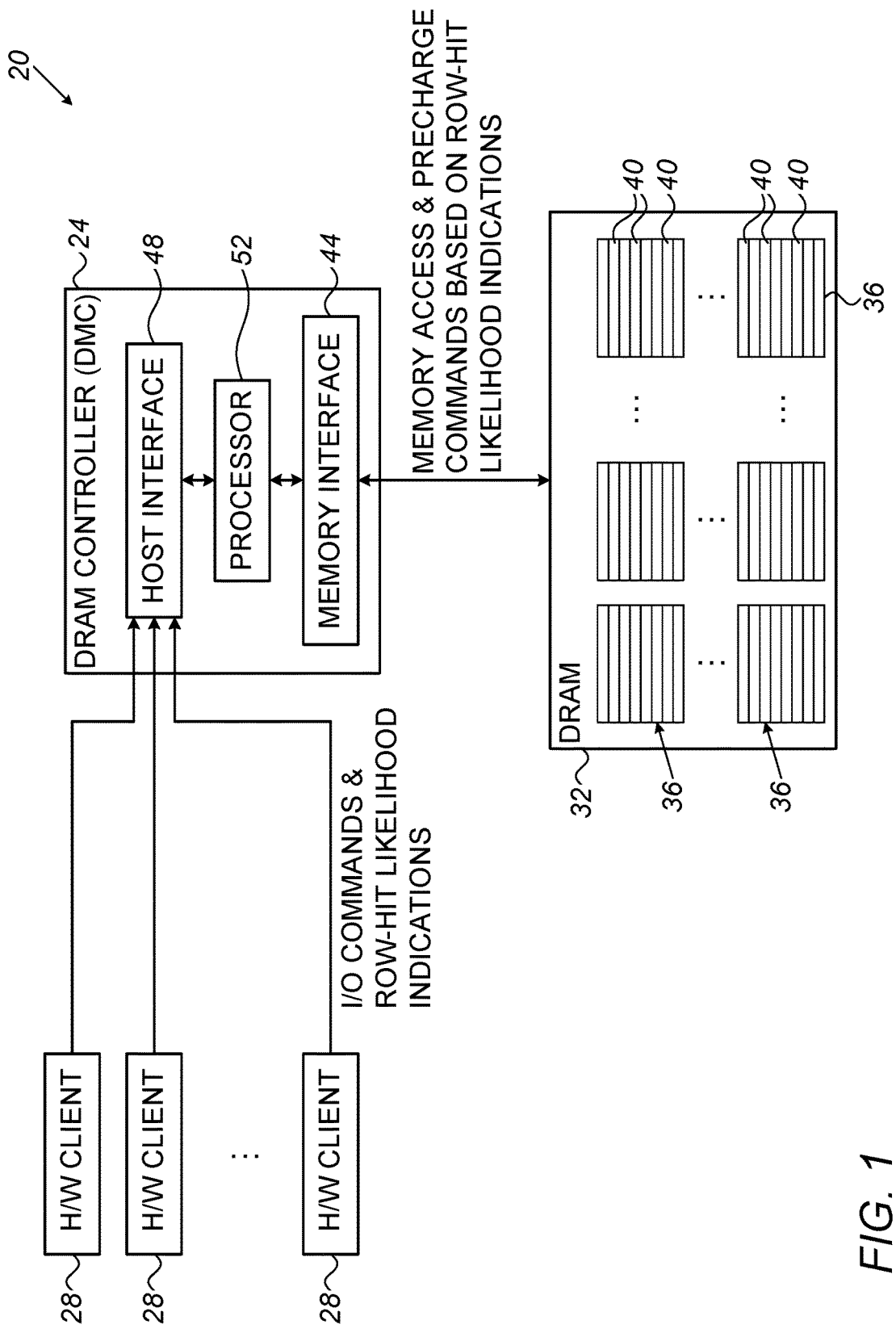
FIG. 1 is a block diagram that schematically illustrates a memory system, in accordance with an embodiment that is described herein.

Embodiments that are described herein provide improved methods and systems for controlling Dynamic Random Access Memory (DRAM) devices. The disclosed techniques are typically implemented in a DRAM Memory Controller (DMC).

A typical DRAM device comprises multiple memory banks (also referred to simply as banks), wherein each bank comprises multiple rows (also referred to as pages). A given memory access command typically accesses (e.g., reads or writes) a word in a specified location within a specified row of a specified bank. A row needs to be activated before it can be accessed, and needs to be deactivated (or "precharged") before a different row in the same bank can be activated. To perform these actions, DRAMs and DMCs typically support an "ACTIVATE" command and a "PRECHARGE" command. Some DRAMs and DMCs also support read and write commands with auto-precharge, which instruct the DRAM to automatically precharge the row being read or written following the read or write command.

In practice, at times it is desirable to precharge a row as soon as an I/O command (e.g., read or write command) is completed, but to retain the row active under different circumstances. Consider, for example, a scenario in which the access pattern to the DRAM is sequential, i.e., there is high likelihood that successive I/O commands will address the same row in the same bank. In such a scenario, it typically is beneficial to retain the row active and to not precharge it between successive I/O commands. Retaining the row active in such a scenario reduces the average latency and increases throughput, because no time is wasted on precharging and then re-activating the same row between successive I/O commands. If, on the other hand, the access pattern to the DRAM is random, successive I/O commands are likely to access different rows. In such a case it typically is preferable to precharge the row immediately following each I/O command (because the next I/O command is relatively unlikely to address the same row) and thus reduce both latency and power consumption.

In the embodiments described herein, the DMC decides adaptively whether and/or when to precharge rows, so as to match the actual access pattern to the DRAM. These decisions are referred to herein as a "precharge policy" or "deactivation policy." Generally, the term "precharging" and "deactivation" are used interchangeably herein.

In some embodiments, a DMC receives I/O commands from one or more clients, for execution in a DRAM. In addition to the I/O commands, the DMC receives from the clients "row-hit likelihood indications" (referred to herein simply as "indications" for brevity). The row-hit likelihood indications are indicative of the likelihoods that a subsequent I/O command will address the same row in the same memory bank as a previous I/O command. Examples or row-hit likelihood indications are described below. The DMC sets the precharge policy adaptively, based on the indications, and executes the I/O commands in the DRAM in accordance with the precharge policy.

In one example embodiment, if the indications imply a random access pattern, the DMC executes the I/O commands using auto-precharge (row deactivated automatically following each command). If the indications imply a sequential access pattern, the DMC executes the I/O commands without auto-precharge (retaining the row being read or written active).

By adapting the precharge policy based on row-hit likelihood indications, the DMC is able to optimize DRAM performance, e.g., latency, throughput and power consumption, depending on the actual access pattern to the DRAM by its clients. If the access pattern changes over time, the disclosed techniques enable the DMC to adapt the precharge policy accordingly.

FIG. 1 is a block diagram that schematically illustrates a memory system 20, in accordance with an embodiment that is described herein. In the example of FIG. 1, system 20 comprises a DRAM controller (DMC) 24, which stores data on behalf of one or more hardware-implemented clients 28 in a DRAM 32.

In one example embodiment, system 20 is implemented as part of a Northbridge-Southbridge chipset of a computer. Such a chipset typically comprises a Northbridge chip (which is connected directly to the computer Central Processing Unit (CPU) and is responsible for fast and high-performance tasks such as access to memory), and a Southbridge chip (which is responsible for slower tasks such as disk access). In this embodiment, DMC 24 is typically part of the Northbridge chip, and clients 28 comprise hardware units such as a Central Processing Unit (CPU) or a Graphics Processing Unit (GPU) of the computer. Generally, however, the disclosed techniques are applicable in any other suitable system, for providing memory services to any other suitable types of clients. One alternative example is implementation in a Network Interface Controller (NIC).

FIG. 1 shows a single DRAM device 32, for the sake of clarity. In alternative embodiments, DMC 24 may control any suitable number of DRAM devices 32. In some embodiments, DMC 24 is connected to multiple DRAM devices 32 in parallel over different bus lines, so as to access a large data width in parallel. In an example embodiment, DMC 24 is connected to eight DRAM devices in parallel, each DRAM device supporting access to eight bits of data, thus providing access to a total of sixty-four bits of data in a single access. Each DRAM 32 may comprise, for example, a DDR3, DDR4 or LPDDR4 device.

DRAM 32 comprises multiple memory banks 36. Each memory bank 36 comprises multiple rows 40. Memory banks 36 are also referred to simply as banks, for brevity, and rows 40 are also referred to as pages. Each bank 36 is typically accessible independently of the other banks 36. In one example implementation, DRAM 32 comprises eight banks 36, each bank 36 comprises 65536 rows 36, and each row 36 stores 4096 bits of data. A given memory-access command issued by DMC 24 typically reads or writes a specified 4-bit, 8-bit or 16-bit word within a specified row of a specified bank. The above numerical values are given solely by way of example, and any other suitable values can be used.

In the present example, DMC 24 comprises a memory interface 44 for communicating with DRAM 32, a host interface 48 for communicating with clients 28, and a processor 52 that is configured to carry out the disclosed techniques.

The configuration of memory system 20 described in FIG. 1, and the configurations of the various system components such as DMC 24, clients 28 and DRAM 32, are example configurations that are depicted solely for the sake of clarity. In alternative embodiments, any other suitable configuration can be used.

Circuit elements that are not mandatory for understanding of the disclosed techniques have been omitted from the figure for the sake of clarity. The different elements of system 20 and its components may be implemented using dedicated hardware or firmware, such as using hard-wired or programmable logic, e.g., in one or more Application-Specific Integrated Circuits (ASICs) or Field-Programmable Gate Arrays (FPGAs). Some elements of system 20, for example processor 52 of DMC 24, may be implemented using software, or using a combination of hardware, software and/or firmware elements.

In some embodiments, processor 52 is implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Typically, DMC 24 receives I/O commands (e.g., read and/or write commands) from clients 28, in an embodiment. DMC 24 executes the I/O commands by issuing memory-access commands to DRAM 32. In an embodiment, DMC issues the memory-access commands to DRAM 32 in accordance with a suitable DDR protocol, such as the JEDEC JESD79-4A Standard, cited above.

As explained above, a given memory-access command issued by DMC 24 typically accesses (e.g., reads or writes) a specified word in a specified location in a specified row 40 of a specified bank 36 of DRAM 32. In a typical DRAM device, the row in question has to be activated before the command is executed. For this purpose, DMC 24 and DRAM 32 support an "ACTIVATE" command that, when issued by the DMC, instructs the DRAM to activate a specified row in a specified bank.

A row needs to be deactivated (or "precharged") before a different row in the same bank can be activated. To this end, DMC 24 and DRAM 32 typically support a "PRECHARGE" command that, when issued by the DMC, instructs the DRAM to deactivate the currently-active row. In some embodiments, DMC 24 and DRAM 32 also support an "auto-precharge" mechanism in which the DRAM automatically deactivates the row following each memory-access command without a need for an explicit PRECHARGE command from the DMC.

The above commands are specified, for example, in the JEDEC JESD79-4A Standard, cited above. The JEDEC standard also specifies certain timing constraints relating to these commands. Some of the specified timing parameters are given in the table below:

| Symbol | Function |
| --- | --- |
| tRP | PRECHARGE command period (from issuance of a PRECHARGE command until bank is ready for a new ACTIVATE command) |
| tRCD | Delay time from issuance of an ACTIVATE command until bank is ready for a new read or write command |
| RL | Read latency |

Consider two successive read commands issued to the same bank 36 at times T1 and T2. The minimum latency for retrieving the data of the second read command depends on (i) whether the two read commands access the same row or different rows, and (ii) whether the read commands are performed with or without auto-precharge. The following table summarizes these minimum latencies:

|  | No Auto-precharge | Auto-precharge |
| --- | --- | --- |
| Different rows | T2 + tRP + tRCD + RL | T2 + tRCD + RL |
| Same row | T2 + RL | T2 + tRCD + RL |

The above example demonstrates why, in an embodiment, the optimal precharge policy depends on the access pattern. When the two read commands access different rows, it is preferable to deactivate (precharge) the row accessed by the first read command immediately after the first read command, e.g., using auto-precharge. This policy reduces the latency by tRP. When both read commands access the same row it is preferable to retain the row read by the first read command active following the first read command, and not precharge the row. Such a policy reduces the latency by tRCD. Note that, in addition, deactivating rows also reduces the DRAM power consumption.

In some embodiments, one or more clients are configured to provide "row-hit likelihood indications" to DMC 24, and DMC 24 is configured to adapt the precharge policy based on the row-hit likelihood indications. In the present context, the term "row-hit likelihood indications" (or simply "indications" for brevity) refers to any information indicative of the likelihoods that a subsequent I/O command will address the same row 40 in the same memory bank 36 as addressed in a previous I/O command.

One example of a row-hit likelihood indication is an indication that specifies whether the access pattern of the I/O commands from a certain client is random or sequential. In a sequential access pattern, such as when a client reads or writes a large file or other object, the client accesses multiple successive memory addresses, and therefore has a relatively high likelihood to access the same row repeatedly. In a random access pattern, e.g., when a client accesses small chunks of data in various non-contiguous addresses, the memory addresses accessed by successive I/O commands are uncorrelated, and therefore the likelihood of repeatedly accessing the same row is relatively small.

Another example of a row-hit indication is an indication of memory-access bandwidth of a certain client 28. Bandwidth indications are useful, for example, for managing paging in a highly congested DRAM 32. In an example embodiment, if the indicated bandwidth is relatively small (e.g., smaller than a predefined bandwidth threshold), DMC 24 sets the precharge policy to prefer precharging the currently-accessed row. If the indicated bandwidth is relatively high (e.g., higher than the predefined bandwidth threshold), DMC 24 sets the precharge policy to prefer retaining the currently-accessed row active. Additionally or alternatively, any of clients 28 may provide DMC 24 with any other suitable type of row-hit likelihood indications.

In some embodiments the row-hit likelihood indications are explicit, i.e., specify explicit likelihoods numerically or in accordance with some predefined convention. In other embodiments the row-hit likelihood indications are implicit, i.e., they are indicative of the likelihoods even though they do not specify the likelihoods explicitly. The row-hit likelihood indications are estimated by clients 28 using any suitable method.

In one example embodiment, the disclosed technique is implemented in a Network Interface Controller (NIC), which analyzes the context of I/O commands. Based on the I/O command context (e.g., based on knowledge of the size of the data item being read or written) the NIC marks each read or write request as either random or sequential. The DMC uses these marks to choose whether to execute read/write commands with auto-precharge (in case or a random pattern) or without auto-precharge (in case or a sequential pattern).

Figure 2:
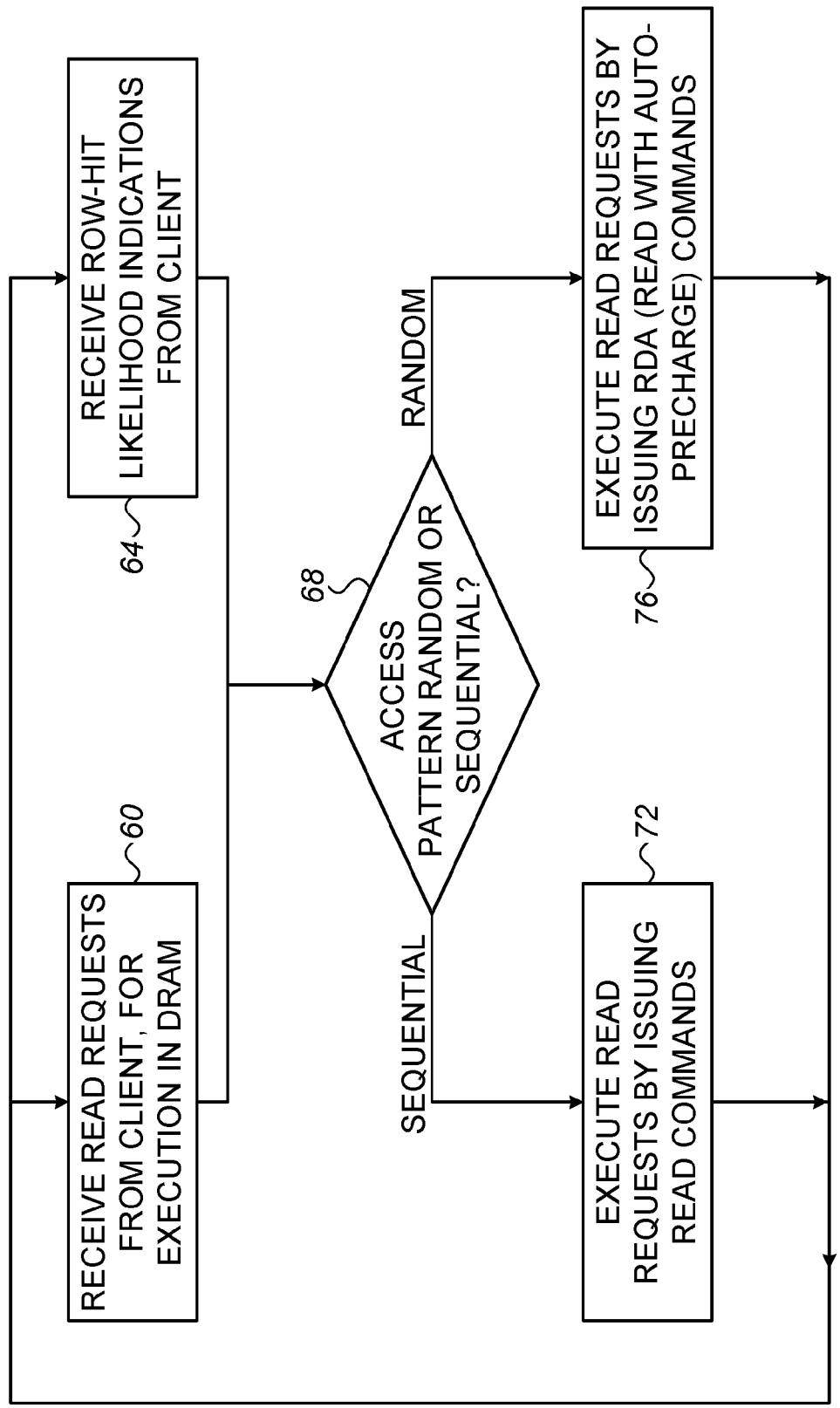
FIG. 2 is a flow chart that schematically illustrates a method for controlling a DRAM, in accordance with an embodiment that is described herein.

FIG. 2 is a flow chart that schematically illustrates a method for controlling DRAM 32 by DMC 24, in accordance with an embodiment that is described herein. The method refers to read commands executed for a single client 28, for the sake of clarity. The disclosed technique is applicable in a similar manner to any other suitable I/O commands, e.g., to write commands or a mix of read and write commands, as well as to any suitable number of clients 28.

The method begins with processor 52 of DMC 24 receiving read requests from client 28, at a read reception operation 60. At an indication reception operation 64, processor 52 receives from client 28 one or more row-hit likelihood indications.

At an access pattern assessment operation 68, processor 52 assesses, based on the row-hit likelihood indications, whether the access pattern of the read requests is random or sequential. In some embodiments the row-hit likelihood indications are Boolean, e.g., comprise a single bit that specifies "random" (unlikely to be followed by a read request addressing the same row) or "sequential" (likely to be followed by a read request addressing the same row). In other embodiments, row-hit likelihood indications specify or imply some soft likelihood value, and processor 52 compares the likelihood value to a predefined likelihood threshold. If the likelihood is larger than the threshold, processor 52 regards the access pattern as sequential, and vice versa.

If processor 52 finds the access pattern to be sequential, processor 52 executes the read requests by issuing normal read commands (without auto-precharge) to DRAM 32, at a read execution operation 72. If, on the other hand, the access pattern is found to be random, processor 52 executes the read requests by issuing to DRAM 32 read commands with auto-precharge, at an auto-precharge read execution operation 76, in an embodiment.

In the embodiments described above, the prefetch policy is adapted by choosing whether to execute I/O commands with or without auto-precharge. In these embodiments, DMC 24 chooses I/O commands with auto-precharge when the row-hit likelihoods are relatively low, and I/O commands without auto-precharge when the row-hit likelihoods are relatively high. More generally, DMC 24 increases the average rate of row deactivation (precharge) in response to a decrease in the row-hit likelihoods, and decreases the average rate of row deactivation in response to an increase in the row-hit likelihoods.

Additionally or alternatively to choosing whether or not to use auto-precharge, in some embodiments processor 52 adapts the time duration, following an I/O command, after which precharge is performed and the row is deactivated. Typically, DMC 24 increases the time duration (retains a row active for a longer duration since the row was most recently accessed) in response to an increase in the row-hit likelihoods, and decreases the time duration in response to a decrease in the row-hit likelihoods.

In these embodiments, processor 52 typically issues a normal I/O command (without auto-precharge), and subsequently issues a self-generated precharge command after the appropriate time duration. For a strictly random access pattern, the above technique typically converges to the minimal time duration supported by DRAM 32. For a strictly sequential access pattern, the above technique typically converges to an infinite time duration, i.e., no precharge is performed until a different row in the same bank needs to be accessed. In intermediate access pattern, which are not strictly random and not strictly sequential, the above technique converges to some intermediate time duration that best matches the actual row-hit likelihood.

Although the embodiments described herein mainly address the use of row-hit likelihood indications in adapting the DRAM precharge policy, the row-hit likelihood indications can be used for other purposes, as well. For example, a caching system may use the row-hit likelihood indications provided by clients 28 for optimizing prefetch operations. In such a solution, the caching system may prioritize prefetching for read operations having a sequential access pattern, and refrain from prefetching for read operations having a random access pattern.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A Dynamic Random Access Memory (DRAM) controller, comprising:
   a memory interface, configured to communicate with a DRAM comprising one or more memory banks; and
   a processor, which is configured:
      to receive Input/Output (I/O) commands, each I/O command addressing a respective memory bank and a respective row within the memory bank to be accessed in the DRAM;
      to further receive one or more indications, indicative of likelihoods that a subsequent I/O command will address a same row in a same memory bank as a previous I/O command;
      to adaptively set, based on the indications, a policy of deactivating rows of the DRAM, by increasing a rate of deactivating the rows in response to a decrease in the likelihoods, and decreasing the rate of deactivating the rows in response to an increase in the likelihoods; and
      to execute the I/O commands in the DRAM in accordance with the policy.

2. The DRAM controller according to claim 1, wherein the processor is configured to adaptively set the policy by choosing between a first type of the I/O command that automatically deactivates the row following execution, and a second type of the I/O command that retains the row active following the execution.

3. The DRAM controller according to claim 2, wherein the first type of the I/O command performs automatic row deactivation, and the second type of the I/O command does not perform automatic row deactivation.

4. The DRAM controller according to claim 1, wherein the processor is configured to adaptively set the policy by setting, based on the indications, a time duration from execution of an I/O command in a row until deactivation of the row.

5. A Dynamic Random Access Memory (DRAM) controller, comprising:
   a memory interface, configured to communicate with a DRAM comprising one or more memory banks; and
   a processor, which is configured:
      to receive Input/Output (I/O) commands, each I/O command addressing a respective memory bank and a respective row within the memory bank to be accessed in the DRAM;
      to further receive one or more indications, indicative of likelihoods that a subsequent I/O command will address a same row in a same memory bank as a previous I/O command;

to adaptively set, based on the indications, a policy of deactivating rows of the DRAM, by increasing a rate of deactivating the rows when the indications indicate that the I/O commands have a random access pattern, and decreasing the rate of deactivating the rows when the indications indicate that the I/O commands have a sequential access pattern; and to execute the I/O commands in the DRAM in accordance with the policy.

6. The DRAM controller according to claim 5, wherein the processor is configured to adaptively set the policy by choosing between a first type of the I/O command that automatically deactivates the row following execution, and a second type of the I/O command that retains the row active following the execution.

7. The DRAM controller according to claim 6, wherein the first type of the I/O command performs automatic row deactivation, and the second type of the I/O command does not perform automatic row deactivation.

8. A Dynamic Random Access Memory (DRAM) controller, comprising:
a memory interface, configured to communicate with a DRAM comprising one or more memory banks; and
a processor, which is configured:
to receive Input/Output (I/O) commands, each I/O command addressing a respective memory bank and a respective row within the memory bank to be accessed in the DRAM;
to further receive one or more indications, indicative of likelihoods that a subsequent I/O command will address a same row in a same memory bank as a previous I/O command;
to adaptively set, based on the indications, a policy of deactivating rows of the DRAM, by increasing a rate of deactivating the rows when the indications indicate that the I/O commands have a bandwidth lower than a bandwidth threshold, and decreasing the rate of deactivating the rows when the indications indicate that the I/O commands have a bandwidth higher than the bandwidth threshold; and
to execute the I/O commands in the DRAM in accordance with the policy.

9. The DRAM controller according to claim 8, wherein the processor is configured to adaptively set the policy by choosing between a first type of the I/O command that automatically deactivates the row following execution, and a second type of the I/O command that retains the row active following the execution.

10. The DRAM controller according to claim 9, wherein the first type of the I/O command performs automatic row deactivation, and the second type of the I/O command does not perform automatic row deactivation.

11. A method for controlling a Dynamic Random Access Memory (DRAM) comprising one or more memory banks, the method comprising:
receiving Input/Output (I/O) commands, each I/O command addressing a respective memory bank and a respective row within the memory bank to be accessed in the DRAM;
receiving one or more indications, indicative of likelihoods that a subsequent I/O command will address a same row in a same memory bank as a previous I/O command;
adaptively setting, based on the indications, a policy of deactivating rows of the DRAM, by increasing a rate of deactivating the rows in response to a decrease in the likelihoods, and decreasing the rate of deactivating the rows in response to an increase in the likelihoods; and
executing the I/O commands in the DRAM in accordance with the policy.

12. The method according to claim 11, wherein executing an I/O command in accordance with the policy comprises choosing between a first type of the I/O command that automatically deactivates the row following execution, and a second type of the I/O command that retains the row active following the execution.

13. The method according to claim 12, wherein the first type of the I/O command performs automatic row deactivation, and the second type of the I/O command does not perform automatic row deactivation.

14. The method according to claim 11, wherein adaptively setting the policy comprises setting, based on the indications, a time duration from execution of an I/O command in a row until deactivation of the row.

15. A method for controlling a Dynamic Random Access Memory (DRAM) comprising one or more memory banks, the method comprising:
receiving Input/Output (I/O) commands, each I/O command addressing a respective memory bank and a respective row within the memory bank to be accessed in the DRAM;
receiving one or more indications, indicative of likelihoods that a subsequent I/O command will address a same row in a same memory bank as a previous I/O command;
adaptively setting, based on the indications, a policy of deactivating rows of the DRAM, by increasing a rate of deactivating the rows when the indications indicate that the I/O commands have a random access pattern, and decreasing the rate of deactivating the rows when the indications indicate that the I/O commands have a sequential access pattern; and
executing the I/O commands in the DRAM in accordance with the policy.

16. A method for controlling a Dynamic Random Access Memory (DRAM) comprising one or more memory banks, the method comprising:
receiving Input/Output (I/O) commands, each I/O command addressing a respective memory bank and a respective row within the memory bank to be accessed in the DRAM;
receiving one or more indications, indicative of likelihoods that a subsequent I/O command will address a same row in a same memory bank as a previous I/O command;
adaptively setting, based on the indications, a policy of deactivating rows of the DRAM, by increasing a rate of deactivating the rows when the indications indicate that the I/O commands have a bandwidth lower than a bandwidth threshold, and decreasing the rate of deactivating the rows when the indications indicate that the I/O commands have a bandwidth higher than the bandwidth threshold; and
executing the I/O commands in the DRAM in accordance with the policy.

17. A system, comprising:
a Dynamic Random Access Memory (DRAM) comprising one or more memory banks;
one or more clients, which are configured to issue Input/Output (I/O) commands, each I/O command addressing a respective memory bank and a respective row within the memory bank to be accessed in the DRAM, and to provide one or more indications, indicative of likelihoods that a subsequent I/O command will address a same row in a same memory bank as a previous I/O command; and a DRAM controller, configured to receive the I/O commands and the indications from the one or more clients, to adaptively set, based on the indications, a policy of deactivating rows of the DRAM, by increasing a rate of deactivating the rows in response to a decrease in the likelihoods, and decreasing the rate of deactivating the rows in response to an increase in the likelihoods, and to execute the I/O commands in the DRAM in accordance with the policy.

* * * * *